US009696385B2

(12) United States Patent
Ehrmann et al.

(10) Patent No.: US 9,696,385 B2
(45) Date of Patent: Jul. 4, 2017

(54) APPARATUS FOR DETECTING THE STATE OF A RECHARGEABLE BATTERY TO BE CHECKED

(71) Applicant: CONTI TEMIC MICROELECTRONIC GMBH, Nürnberg (DE)

(72) Inventors: Martin Ehrmann, Nuremberg (DE); Peter Maisel, Nuremberg (DE)

(73) Assignee: CONTI TEMIC MICROELECTRONICS GMBH, Nuremberg (DE)

( * ) Notice: Subject to any disclaimer, the term of this patent is extended or adjusted under 35 U.S.C. 154(b) by 0 days.

(21) Appl. No.: 14/360,951

(22) PCT Filed: Nov. 30, 2012

(86) PCT No.: PCT/EP2012/074035
§ 371 (c)(1),
(2) Date: May 28, 2014

(87) PCT Pub. No.: WO2013/079636
PCT Pub. Date: Jun. 6, 2013

(65) Prior Publication Data
US 2015/0008929 A1    Jan. 8, 2015

(30) Foreign Application Priority Data

Dec. 2, 2011    (DE) .................. 10 2011 087 678

(51) Int. Cl.
*G01N 27/416*    (2006.01)
*G01R 31/36*    (2006.01)
(Continued)

(52) U.S. Cl.
CPC ........ *G01R 31/3679* (2013.01); *B60L 3/0046* (2013.01); *B60L 11/1861* (2013.01);
(Continued)

(58) Field of Classification Search
CPC ...... H02J 7/0021; H02J 7/0026; H02J 7/0047; G01R 31/3658; G01R 31/3679
(Continued)

(56) References Cited

U.S. PATENT DOCUMENTS 7,586,290 B2    9/2009    Hirata et al. .................. 320/132
7,889,524 B2    2/2011    Lee et al. ........................ 363/65
(Continued)

FOREIGN PATENT DOCUMENTS

CN    1707280 A    12/2005    ................ B60L 3/00
DE    102004035470 A1    2/2005    ............. G01R 31/36
(Continued)

OTHER PUBLICATIONS

International Search Report and Written Opinion, Application No. PCT/EP2012/074035, 14 pages, Oct. 9, 2013.
(Continued)

*Primary Examiner* — Edward Tso
(74) *Attorney, Agent, or Firm* — Slayden Grubert Beard PLLC

(57) ABSTRACT

An apparatus for detecting the state of a checkable storage battery in a vehicle having at least two vehicle onboard power supply systems of different operating voltages is provided. The vehicle onboard power supply systems are coupled by a DC/DC converter, which converts a first DC voltage of a first vehicle onboard power supply system into a second DC voltage of the storage battery in the second vehicle onboard power supply system. The vehicle onboard power supply systems have a control device that includes a test signal module configured to supply a test signal via the DC/DC converter to the checkable storage battery, a measured value detection module configured to measure the reaction values of the checkable storage battery, and an (Continued)

evaluation module configured to detect the state of the storage battery from the measured reaction values.

16 Claims, 3 Drawing Sheets

(51) Int. Cl.
  *B60L 3/00* (2006.01)
  *B60L 11/18* (2006.01)
  *H02J 7/00* (2006.01)
  *G01R 31/00* (2006.01)

(52) U.S. Cl.
  CPC ...... *B60L 11/1868* (2013.01); *G01R 31/3624* (2013.01); *G01R 31/3627* (2013.01); *H02J 7/0047* (2013.01); *G01R 31/007* (2013.01); *Y02T 10/7005* (2013.01); *Y02T 10/7016* (2013.01); *Y02T 10/7044* (2013.01); *Y02T 10/7066* (2013.01)

(58) Field of Classification Search
  USPC ........ 320/104, 132, 149; 324/426, 427, 430, 324/433
  See application file for complete search history.

(56) References Cited

U.S. PATENT DOCUMENTS

| | | | |
|---|---|---|---|
| 2005/0280396 A1 | 12/2005 | Hirata et al. | 320/132 |
| 2008/0024137 A1 | 1/2008 | Carlin et al. | 324/427 |
| 2009/0015193 A1 | 1/2009 | Esaka et al. | 320/103 |

FOREIGN PATENT DOCUMENTS

| | | | |
|---|---|---|---|
| EP | 0807546 A1 | 11/1997 | B60L 11/18 |
| WO | 2013/079636 A2 | 6/2013 | B60L 11/18 |

OTHER PUBLICATIONS

Chinese Office Action, Application No. 201280059360.8, 13 pages, Oct. 9, 2015.

APPARATUS FOR DETECTING THE STATE OF A RECHARGEABLE BATTERY TO BE CHECKED

CROSS-REFERENCE TO RELATED APPLICATIONS

This application is a U.S. National Stage Application of International Application No. PCT/EP2012/074035 filed Nov. 30, 2012, which designates the United States of America, and claims priority to DE Application No. 10 2011 087 678.2 filed Dec. 2, 2011, the contents of which are hereby incorporated by reference in their entirety.

TECHNICAL FIELD

A description is given of an apparatus for detecting the state of a rechargeable battery to be checked in a vehicle having at least two vehicle onboard power supply systems having different operating voltages. The vehicle onboard power supply systems are coupled via a DC/DC converter, which converts a first DC voltage of a first vehicle onboard power supply system into a second DC voltage of the rechargeable battery of the second vehicle onboard power supply system. The vehicle onboard power supply systems comprise a control device.

BACKGROUND

In this respect, the document U.S. Pat. No. 7,889,524 B2 is an integrated bidirectional converter for hybrid vehicles with electrical charging, said converter comprising a single induction coil as an inductive store and enabling an electrical charging function via an AC/DC converter. Furthermore, in a so-called boost function, by means of the bidirectional DC/DC converter, power of a rechargeable battery can be supplied to a first vehicle onboard power supply system with a higher operating voltage than the rechargeable battery and, conversely, in a so-called buck function, it is possible to output power from the first vehicle onboard power supply system to the rechargeable battery in a second vehicle onboard power supply system with the operating voltage of the rechargeable battery. For this purpose, the vehicle onboard power supply systems coupled via the DC/DC converter comprise a control device.

However, the state of a rechargeable battery in such vehicle onboard power supply systems is neither indicated nor checked in the vehicle. By contrast, in conventional vehicles having a 12 V onboard power supply system and internal combustion engine, a test of a 12 V rechargeable battery implicitly takes place during every process of starting the internal combustion engine. In this case, a high current is drawn from the rechargeable battery during the starting process. If the starting process is then possible, this is associated with a check of the minimum state of charge, also called SOC state, and of the aging state, also designated as SOH state (State of Health). If the starting process is not possible, either the minimum SOC state or the minimum SOH state of the rechargeable battery cannot be provided, with the result that the vehicle cannot be started up.

This means that in conventional vehicles a safety risk as a result of an inadequately functioning battery cannot occur either. However, in hybrid vehicles or electric vehicles, which usually comprise vehicle onboard power supply systems having different operating voltages, such as a high-voltage side and a low-voltage side, and which do not have a starter on the low-voltage side, this starting process test and thus the conventional test on the low-voltage side is omitted.

However, since a minimum SOC state and a minimum SOH state of the low-voltage rechargeable battery are required for safe operation of these vehicles, too, a corresponding check must be carried out recurrently in these vehicles, too. This check of the rechargeable battery is carried out with the aid of vehicle-external checking devices at correspondingly prescribed maintenance intervals. However, if the registered keeper of the vehicle does not adhere to said intervals, then such vehicles constitute a safety risk which can only be reduced by a timely warning of the driver of the vehicle.

SUMMARY

One embodiment provides an apparatus for detecting the state of a rechargeable battery to be checked in a vehicle having at least two vehicle onboard power supply systems having different operating voltages, comprising: a DC/DC converter, which converts a first DC voltage of a first vehicle onboard power supply system into a second DC voltage of the rechargeable battery of the second vehicle onboard power supply system; a control device of the vehicle onboard power supply systems, wherein the control device of the vehicle onboard power supply systems additionally comprises: a test signal module suitable for applying a test signal to the rechargeable battery to be checked via the DC/DC converter, a measured value detection module suitable for measuring the reaction values of the rechargeable battery to be checked, and an evaluation module suitable for detecting the state of the rechargeable battery from the measured reaction values.

In a further embodiment, the test signal module comprises a voltage jump transmitter module and the measured value detection module comprises an ammeter module, which detects the temporal profile of the current as a reaction of the rechargeable battery.

In a further embodiment, the test signal module comprises a current jump transmitter module and the measured value detection module comprises a voltmeter module, which detects the temporal profile of the voltage as a reaction of the rechargeable battery.

In a further embodiment, the test signal module comprises a voltage pulse transmitter module and the measured value detection module comprises an ammeter module, which detects the temporal profile of the current as a reaction of the rechargeable battery.

In a further embodiment, the test signal module comprises a current pulse transmitter module and the measured value detection module comprises a voltmeter module, which detects the temporal profile of the voltage as a reaction of the rechargeable battery.

In a further embodiment, the test signal module comprises an AC voltage transmitter module and the measured value detection module comprises an ammeter module, which detects the profile of the current as a reaction of the rechargeable battery.

In a further embodiment, the test signal module comprises an AC current transmitter module and the measured value detection module comprises a voltmeter module, which detects the temporal profile of the voltage as a reaction of the rechargeable battery.

In a further embodiment, the evaluation module co-operates with an indicator module, wherein the indicator module indicates an optical indicator for a state of charge.

In a further embodiment, the evaluation module cooperates with an indicator module, and wherein the indicator module indicates an optical indicator for an SOH state.

In a further embodiment, the apparatus comprises a warning module, which generates a warning sign and/or a warning signal by means of the optical and/or an acoustic indicator in the case of a critical state of charge and/or a critical SOH state.

BRIEF DESCRIPTION OF THE DRAWINGS

Example embodiments of the invention are explained in greater detail below with reference to the accompanying figures, in which.

DETAILED DESCRIPTION

Figure 1:
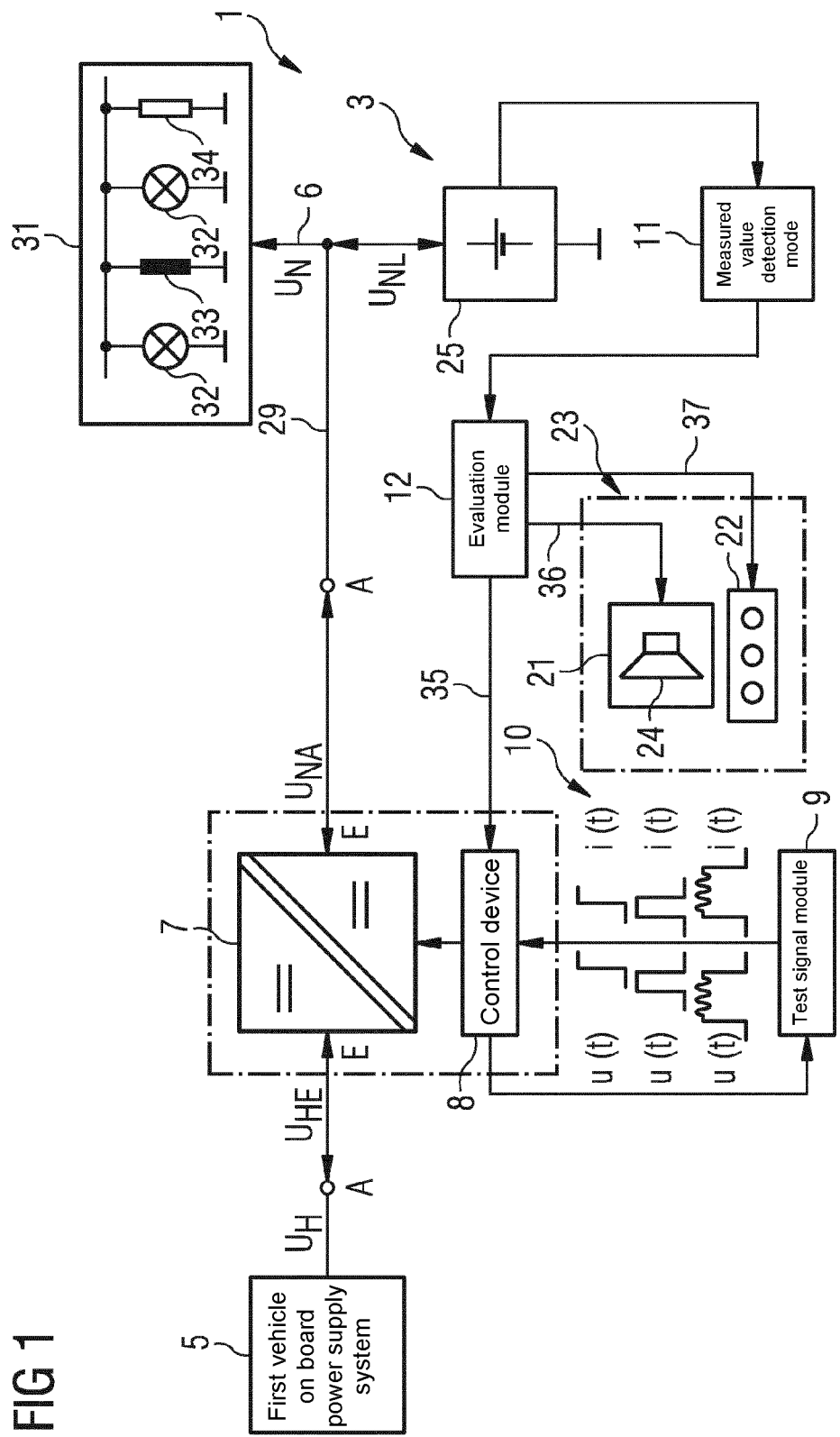
FIG. 1 shows a schematic block diagram of a first example embodiment of the invention.

Embodiments of the present invention provide an apparatus for detecting the state of a rechargeable battery to be checked, which apparatus makes it possible to continuously monitor and indicate the state of a rechargeable battery of a vehicle independently of maintenance and checking intervals.

One embodiment provides a device for detecting the state of a rechargeable battery to be checked in a vehicle having at least two vehicle onboard power supply systems having different operating voltages. The vehicle onboard power supply systems are coupled via a DC/DC converter, which converts a first DC voltage of a first vehicle onboard power supply system into a second DC voltage of the rechargeable battery of the second vehicle onboard power supply system. The onboard power supply systems comprise a control device. The control device comprises a test signal module suitable for applying a test signal to the rechargeable battery to be checked via the DC/DC converter. Moreover, the control device additionally comprises a measured value detection module suitable for measuring the reaction values of the rechargeable battery to be checked, and an evaluation module suitable for detecting the state of the rechargeable battery from the measured reaction values.

A number of the functional units described in this specification are designated as modules in order to emphasize particularly their independence in respect of embodiment. In this connection, modules can include hardware circuits with one or a plurality of processors with memory, very large scale integration circuits (VLSI), gate arrays, programmable logic and/or discrete components. The hardware circuits can perform logic functions, execute computer-readable programs stored on tangible storage devices and/or perform programmed functions. Modules can also include a computer-readable storage medium comprising a computer-readable program stored on a tangible storage device which performs a function if it is executed by a hardware circuit such as a processor, microprocessor or the like.

One advantage of such an apparatus is, firstly, that for this apparatus components such as the DC/DC converter, for example, are already present in vehicles of this type such as hybrid or electric vehicles and are available in practice for a diagnosis of a battery to be checked, including the possibility of identifying not only the state of charge but also the state of health at an early stage and thus of being able to provide an indication about a timely exchange of the rechargeable battery before a breakdown of the vehicle jeopardizes the safety of the vehicle and of the occupants.

The apparatus for detecting the state of a rechargeable battery to be checked may provide the advantage that the rechargeable battery can be continuously checked by means of the control device of the vehicle onboard power supply systems and the registered keeper of the vehicle is no longer dependent on the maintenance intervals or repair intervals stipulated by the manufacturer. Furthermore, the registered keeper of the vehicle no longer has to rely on separate battery test apparatuses such as are available in the workshops. Moreover, with the aid of the indicator module, said keeper can continuously track how the state of charge of the rechargeable battery develops and whether the charging capacity of the rechargeable battery decreases over the course of time and falls below a critical SOH state, such that reliable operation of the vehicle is no longer ensured.

In one embodiment, the test signal module comprises a voltage jump transmitter module and the measured value detection module comprises an ammeter module, which detects the temporal profile of the current as a reaction of the rechargeable battery. Such a voltage jump of a voltage jump transmitter module can be either a charging voltage increase or a charging voltage decrease, wherein in the former case the charging current of the rechargeable battery has to increase significantly and in the latter case the charging current of the rechargeable battery is reduced.

Furthermore, it is also possible for the test signal module to comprise a current jump transmitter module and for the measured value detection module to have a voltmeter module. The voltmeter module can detect the temporal profile of the voltage as a reaction of the rechargeable battery. What is crucial here is how fast the rechargeable battery voltage recovers from the current jump if the test signal is a drawn current jump.

Furthermore, it is provided that the test signal module comprises a voltage pulse transmitter module and the measured value detection module comprises an ammeter module, which detects the temporal profile of the current as a reaction of the rechargeable battery. In the case of such a test signal in the form of a voltage pulse, it is a matter of whether the voltage pulse increases the charging voltage of the rechargeable battery or reduces it for the time of the test pulse. The more distinctly and more rapidly the rechargeable battery reacts to such a change in the charging voltage, the more certainly it can be assumed that the rechargeable battery is fully functional. It is only if anomalies can be ascertained in the reaction of the rechargeable battery that a defect of the rechargeable battery can be assumed.

In a further embodiment, the test signal module comprises a current pulse transmitter module and the measured value detection module comprises a voltmeter module.

The voltmeter module detects the temporal profile of the voltage as a reaction of the rechargeable battery. In such a test, a discharge current is impressed on the rechargeable battery briefly for the pulse duration and how fast the battery recovers from the current pulse is observed. In this case, a high energy loss does not arise in the overall system of the vehicle networks, since such a test is carried out with the aid of the bidirectional DC/DC converter and the test energy is buffer-stored in the common inductive store, such that only a small proportion constitutes a test energy loss.

Finally, it is also possible to equip the test signal module with an AC voltage transmitter module and to embody the measured value detection module as an ammeter module, such that the profile of the current as a reaction of the rechargeable battery to the applied AC voltage can be detected by the ammeter module. With test signals of an AC voltage transmitter module it is possible to check the internal resistance of a rechargeable battery, which yields an indication about whether, for example, a lead-acid rechargeable battery has a sufficient liquid level, since the internal resistance of a lead-acid rechargeable battery increases as the liquid level decreases.

Alternatively, the test signal module can comprise an AC current transmitter module and the measured value detection module can have a voltmeter module. The voltmeter module detects the temporal profile of the voltage as a reaction of the rechargeable battery to the impressed AC current. In this embodiment of the apparatus, too, the internal resistance of the battery can be deduced and, for example, the liquid state of a lead-acid rechargeable battery can be deduced in the event of a variation of the internal resistance of the battery.

Furthermore, it is provided that the evaluation module co-operates with an indicator module, wherein the indicator module indicates an optical indicator for a state of charge. Consequently, the driver of a vehicle can always recognize whether the rechargeable battery constitutes a safety risk or whether the state of charge of the rechargeable battery is sufficient to ensure operation of the vehicle.

Furthermore, it is provided that the evaluation module co-operates with an indicator module, wherein the indicator module comprises an optical indicator for the state of health. Before the SOH state has fallen below the permissible minimum SOH state, it is recommendable to externally check the rechargeable battery and exchange it, if appropriate.

It is advantageous in this connection if the apparatus comprises a warning module, which generates a warning sign and/or a warning signal by means of the optical and/or an acoustic indicator module in the case of a critical state of charge and/or a critical SOH state.

In a further embodiment, it is provided that the rechargeable battery to be checked comprises a lead-acid rechargeable battery in one of the at least two vehicle onboard power supply systems. In the case of a lead-acid rechargeable battery, this test is crucial because it is usually the case for hybrid vehicles that the electric motor present is used to start the internal combustion engine of the vehicle; there is no starting process in electric vehicles. The conventional automatic test with regard to the SOC state and the SOH state of the lead-acid rechargeable battery when starting the vehicle is thus omitted.

In a further embodiment, the first vehicle onboard power supply system has a higher DC voltage than the second vehicle onboard power supply system, wherein the first vehicle onboard power supply system can comprise a lithium-ion rechargeable battery. Such a lithium-ion rechargeable battery includes a multiplicity of individual cells which, however, in total can provide a high operating voltage which can comprise up to a few hundred volts. However, for vehicles, as high operating voltage a voltage is provided which is below the voltage liable to be dangerous to persons and therefore does not exceed the value of 100 V. Otherwise it is necessary to provide special safety shields and safety circuits in order to ensure that, even in the event of accidents, no danger can arise from the high-voltage power supply system.

Furthermore, it is provided that the first vehicle onboard power supply system having a high operating voltage comprises an AC/DC converter, which converts a three-phase generator AC voltage of a three-phase AC generator into a DC charging voltage of, for example, a high-voltage lithium-ion rechargeable battery. The two vehicle networks having a high operating voltage and having a low operating voltage, respectively, are coupled to one another via the DC/DC converter mentioned above.

In this case, the DC/DC converter is embodied as a bidirectional DC/DC converter and converts, for example, a DC charging voltage of the lithium-ion rechargeable battery into a lower charging voltage of a lead-acid rechargeable battery, wherein the energy for the test signals is recovered for the most part by means of a common inductive storage unit of the bidirectional DC/DC converter.

The test signal module is designed in such a way that it is suitable for applying a test signal via the DC/DC converter to the lead-acid rechargeable battery, which co-operates with a measured value detection module suitable for measuring the reaction values of the lead-acid rechargeable battery and for forwarding them to an evaluation module. The evaluation module, for its part, has already been thoroughly discussed and can thus detect the state of the lead-acid rechargeable battery from the measured reaction values and indicate the state of charge or else the SOH state of the lead-acid rechargeable battery separately or by means of a central indicator module assigned to the control device.

The block diagram in accordance with FIG. 1 shows an apparatus 1 in accordance with a first example embodiment of the invention. In the block diagram, a first vehicle onboard power supply system having a high operating voltage $U_H$ is coupled to a second vehicle onboard power supply system 6 via a DC/DC converter 7. For this purpose, on the high-voltage side of the DC/DC converter 7, a high input voltage $U_{HE}$ is present during energy transfer in arrow direction E and, on the low-voltage side, the DC/DC converter 7 has a lower output voltage $U_{NA}$ of the order of magnitude of the second operating voltage $U_H$ for the second operating power supply system 6.

Said DC/DC converter 7 is designed as a bidirectional converter, such that the input and the output for an energy transfer can also be interchanged, that is to say that the high-voltage side is fed from the low-voltage side and, conversely, the low-voltage side is fed from the high-voltage side. This is possible owing to the use of a common inductive store of the DC/DC converter 7 and is symbolized by the arrow directions E and A in FIG. 1, wherein E stands for input and A stands for output.

Not only loads 31 such as lighting elements 32, inductively acting windings 33 or heating resistors 34 of an electrical heating system but also a rechargeable battery 3 are connected to a BUS line 29 of the second vehicle onboard power supply system 6 having a correspondingly low operating voltage $U_N$. In order to check the state of charge and the SOH state of the rechargeable battery 3 continuously during the operation of the vehicle, a control device 8, which co-operates with the DC/DC converter 7, is arranged at least in the vehicle onboard power supply system 6.

A test signal 10 of a test signal module 9, which serves for checking the state of the rechargeable battery 3, is fed to the DC/DC converter 7. A measured value detection module 11 is connected to the rechargeable battery 3 and detects the temporal profile of a reaction to the test signal 10 and feeds this value to an evaluation module 12.

The evaluation module 12 is firstly connected via a connecting line 35 to the control device 8 and coupled via the lines 36 and to an indicator module 21. The indicator module 21 firstly comprises an optical indicator 22 and an acoustic indicator 24 and can also be used as a warning module 23 if critical values of the state of charge of the rechargeable battery 3 or critical values of the charging capacity of the rechargeable battery 3 are undershot. Consequently, at any time the driver of the vehicle has an indication of whether the function or the state of the rechargeable battery 3 is in the green range, that is to say in a safe operating state.

Figure 2:
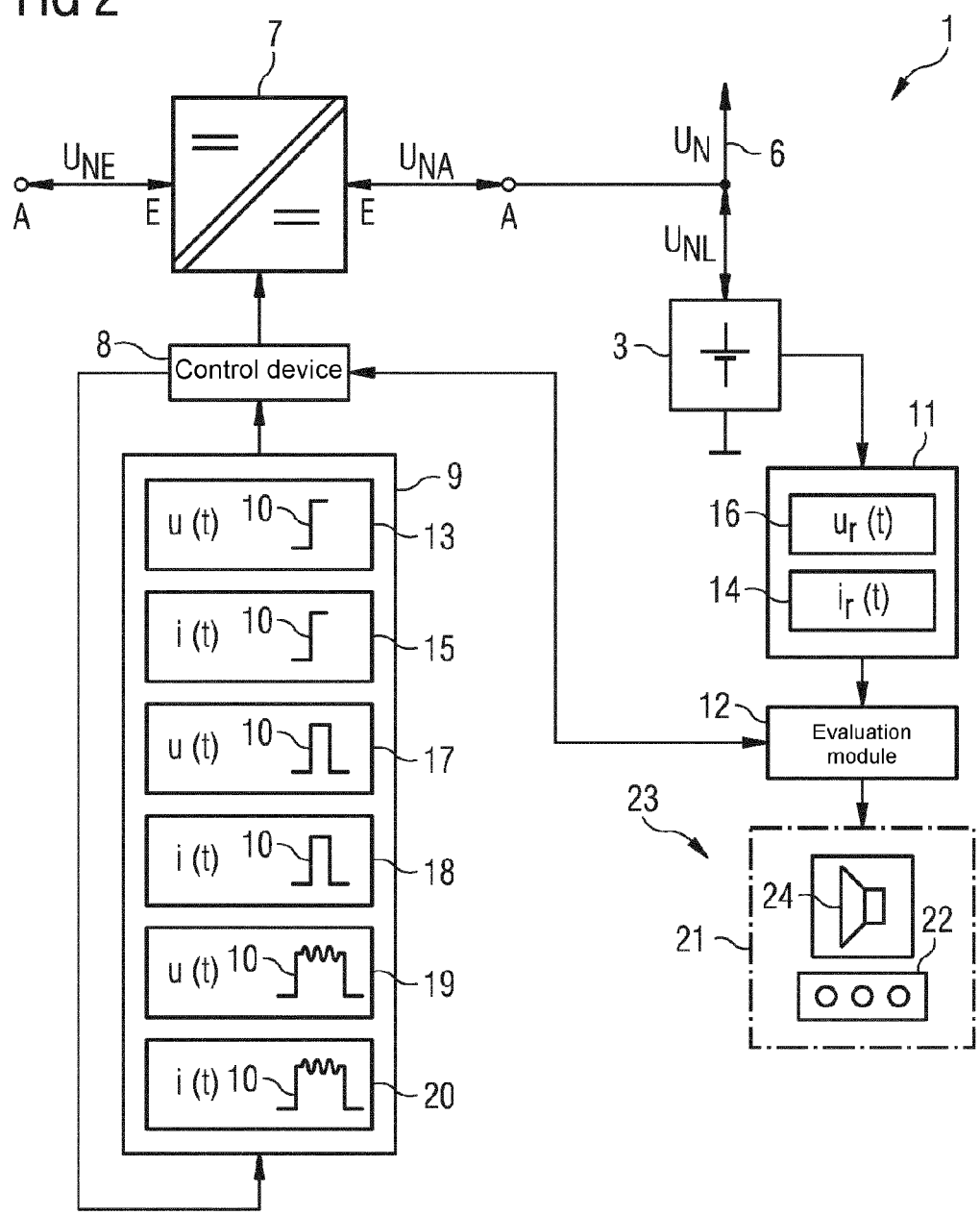
FIG. 2 shows an extended schematic block diagram of the embodiment in accordance with FIG. 1.

FIG. 2 shows an extended schematic block diagram of the embodiment in accordance with FIG. 1. Components having functions identical to those in FIG. 1 are identified by identical reference signs and are not discussed separately in the following figures.

FIG. 2 then illustrates in detail which modules firstly in the test signal module 9 can generate or output a test signal and which modules in the measured value detection module 11 detect the temporal profile of the reaction of the rechargeable battery 3. For this purpose, the test signal module 9 can comprise a voltage jump transmitter module 13, which with u(t) can implement a voltage jump on the rechargeable battery 3 via the control device 8 and the DC/DC converter 7. Alternatively, the test signal module 9 can comprise a current jump transmitter module 15, which with i(t) can implement a current jump on the rechargeable battery 3 via the control device 8 and the DC/DC converter 7.

Furthermore, the test signal module 9 can comprise a voltage pulse transmitter module 17, which can implement a voltage pulse with u(t) on the rechargeable battery 3 via the control device 8 and the DC/DC converter 7. Alternatively, the test signal module 9 can comprise a current pulse transmitter module 18, which can cause a current pulse with i(t) to act on the rechargeable battery 3 via the control device 8 and the DC/DC converter 7.

Finally, it is also possible for the test signal module 9 to comprise an AC voltage transmitter module 19, which can implement an AC voltage with u(t) on the rechargeable battery 3 via the control device 8 and the DC/DC converter 7. Alternatively, the test signal module 9 can comprise an AC current transmitter module 20, which can cause an AC current i(t) to act on the rechargeable battery 3 via the control device 8 and the DC/DC converter 7.

The temporal profile of the reaction of the rechargeable battery to be checked is measured by the measured value detection module 11 with the aid of a voltmeter module 16, which detects the reaction voltage $u_r(t)$, or with the aid of an ammeter module 14, which detects the reaction current $i_r(t)$. As already explained with FIG. 1, the measured and detected values are fed to an evaluation module 12, which for its part cooperates with an indicator module 21 and has optical indicators 22 and acoustic indicators 24.

Figure 3:
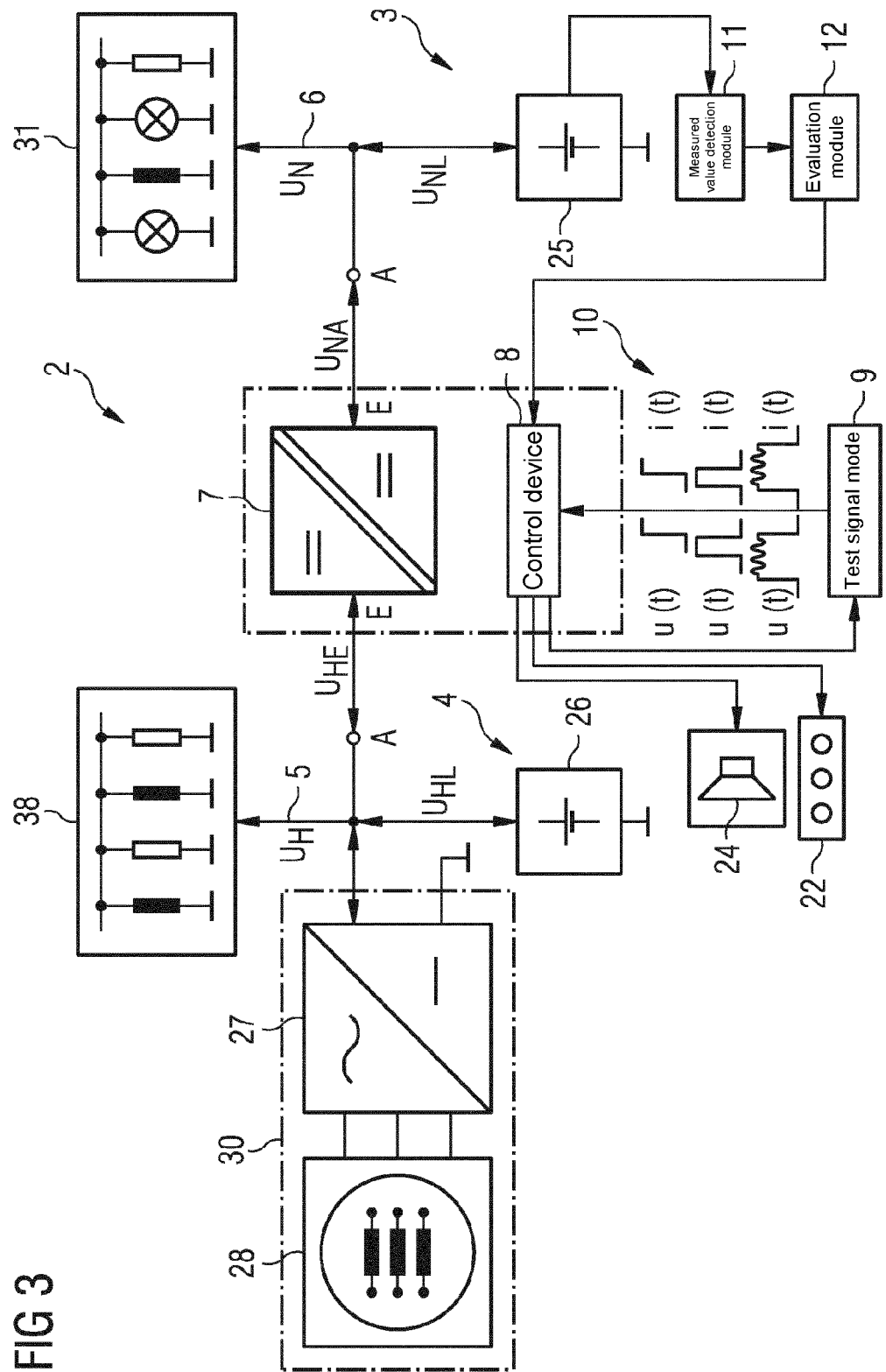
FIG. 3 shows a schematic block diagram in accordance with a second example embodiment of the invention.

FIG. 3 shows a schematic block diagram of an apparatus 2 in accordance with a second example embodiment of the invention. The second embodiment comprises the details of the first embodiment, as already shown in FIGS. 1 and 2, and exhibits components of the first vehicle onboard power supply system 5 having a high operating voltage $U_H$. The loads 38 of the first vehicle onboard power supply system 5 differ from the loads 31 in the second vehicle onboard power supply system 6 merely in the connection voltage or the operating voltage at which the loads 38 can be operated.

The first vehicle onboard power supply system 5 obtains its power from a three-phase AC generator 28, which cooperates with an AC/DC converter 27 in a charging apparatus 30. In a hybrid vehicle, said charging apparatus 30 can comprise the vehicle's own generator, which can also be used as an electric motor drive by means of changeover, or said charging apparatus 30 can be connected to a supply system directly by means of a three-phase power supply system connection, and can thus ultimately also cooperate with a three-phase AC voltage generator 28 which provides the power for a charging apparatus 30. By means of this charging apparatus 30, a first rechargeable battery 4 is charged with a charging voltage $U_{HL}$, wherein the said first rechargeable battery 4 in this embodiment is a lithium-ion rechargeable battery 26.

On account of the bidirectional action of the DC/DC converter 7 that couples the two vehicle networks 5 and 6, the lithium-ion rechargeable battery 26 of the first vehicle power supply system can also charge the lead-acid rechargeable battery 25 to be checked in the second vehicle onboard power supply system 6 with a low charging voltage $U_{NL}$. Conversely, the rechargeable battery 3 can also charge the lithium-ion rechargeable battery 26 via the DC/DC converter 7. By virtue of the bidirectional coupling of the two networks 5 and 6 via the DC/DC converter, the energy required for test signal generation is not lost, but rather is buffer-stored by means of an inductive storage element (not shown) of the DC/DC converter 7, with the result that only a small proportion of the energy required for generating the test signal is lost.

LIST OF REFERENCE SIGNS

1 Apparatus (1st embodiment)
2 Apparatus (2nd embodiment)
3 Rechargeable battery
4 First rechargeable battery
5 First vehicle onboard power supply system
6 Second vehicle onboard power supply system
7 DC/DC converter
8 Control device
9 Test signal module
10 Test signal
11 Measured value detection module
12 Evaluation module
13 Voltage jump transmitter module
14 Ammeter module
15 Current jump transmitter module
16 Voltmeter module
17 Voltage pulse transmitter module
18 Current pulse transmitter module
19 AC voltage transmitter module
20 AC current transmitter module
21 Indicator module
22 Optical indicator
23 Warning module
24 Acoustic indicator
25 Lead-acid rechargeable battery
26 Lithium-ion rechargeable battery
27 AC/DC converter
28 AC generator (three-phase)
29 BUS line
30 Charging apparatus
31 Load
32 Lighting element
33 Inductive windings
34 Heating resistor
35 Connecting line
36 Line
37 Line
38 Load
A Output
E Input
$U_H$ High operating voltage
$U_N$ Low operating voltage
$U_{HE}$ High input voltage $U_{NA}$ Low output voltage
$U_{HL}$ High DC charging voltage
$U_{NL}$ Low DC charging voltage
$u_r(t)$ Voltage profile
$i_r(t)$ Current profile

What is claimed is:

1. An apparatus for detecting a state of a rechargeable battery to be checked in a vehicle having at least two vehicle onboard power supply systems having different operating voltages, the apparatus comprising:
a DC/DC converter that converts a first DC voltage of a first vehicle onboard power supply system into a second DC voltage of the rechargeable battery of the second vehicle onboard power supply system;
a control device of the vehicle onboard power supply systems, the control device comprising:
a test signal module configured to apply a test signal to the rechargeable battery to be checked via the DC/DC converter,
a measured value detection module configured to measure the reaction values of the rechargeable battery to be checked, and
an evaluation module configured to detect the state of the rechargeable battery based on the measured reaction values.

2. The apparatus of claim 1, wherein:
the test signal module comprises a voltage jump transmitter module, and
the measured value detection module comprises an ammeter module configured to detect a temporal profile of the current as a reaction of the rechargeable battery.

3. The apparatus of claim 1, wherein:
the test signal module comprises a current jump transmitter module, and
the measured value detection module comprises a voltmeter module configured to detect a temporal profile of the voltage as a reaction of the rechargeable battery.

4. The apparatus of claim 1, wherein:
the test signal module comprises a voltage pulse transmitter module, and
the measured value detection module comprises an ammeter module configured to detect a temporal profile of the current as a reaction of the rechargeable battery.

5. The apparatus of claim 1, wherein:
the test signal module comprises a current pulse transmitter module, and
the measured value detection module comprises a voltmeter module configured to detect a temporal profile of the voltage as a reaction of the rechargeable battery.

6. The apparatus of claim 1, wherein:
the test signal module comprises an AC voltage transmitter module, and
the measured value detection module comprises an ammeter module configured to detect a profile of the current as a reaction of the rechargeable battery.

7. The apparatus of claim 1, wherein:
the test signal module comprises an AC current transmitter module, and
the measured value detection module comprises a voltmeter module configured to detect a temporal profile of the voltage as a reaction of the rechargeable battery.

8. The apparatus of claim 1, wherein the evaluation module co-operates with an indicator module that indicates an optical indicator for a state of charge.

9. The apparatus of claim 1, wherein the evaluation module co-operates with an indicator module and that indicates an optical indicator for a state of health (SOH) state.

10. The apparatus of claim 1, wherein the apparatus comprises a warning module configured to generate at least one of a warning sign and a warning signal via at least one of an optical and an acoustic indicator in response to critical state of charge or a critical state of health (SOH) state.

11. A method for detecting a state of a rechargeable battery to be checked in a vehicle having at least two vehicle onboard power supply systems having different operating voltages, the method comprising:
converting a first DC voltage of a first vehicle onboard power supply system into a second DC voltage of the rechargeable battery of the second vehicle onboard power supply system using a DC/DC converter;
performing a control process by a control device of the vehicle onboard power supply systems, the control process comprising:
applying a test signal to the rechargeable battery to be checked via the DC/DC converter,
measuring the reaction values of the rechargeable battery to be checked, and
detecting the state of the rechargeable battery based on the measured reaction values.

12. The method of claim 11, wherein measuring the reaction values of the rechargeable battery comprises detecting by an ammeter module a temporal profile of the current as a reaction of the rechargeable battery.

13. The method of claim 11, wherein measuring the reaction values of the rechargeable battery comprises detecting by a voltmeter module a temporal profile of the voltage as a reaction of the rechargeable battery.

14. The method of claim 11, comprising controlling an optical indicator for a state of charge.

15. The method of claim 11, comprising controlling an optical indicator for a state of health (SOH) state.

16. The method of claim 11, comprising generating at least one of a warning sign and a warning signal via at least one of an optical and an acoustic indicator in response to a critical state of charge or a critical state of health (SOH) state.

* * * * *